(12) United States Patent
Goorden et al.

(10) Patent No.: US 11,086,240 B2
(45) Date of Patent: Aug. 10, 2021

(54) METROLOGY SENSOR, LITHOGRAPHIC APPARATUS AND METHOD FOR MANUFACTURING DEVICES

(71) Applicant: ASML NETHERLANDS B.V., Veldhoven (NL)

(72) Inventors: Sebastianus Adrianus Goorden, Eindhoven (NL); Nitesh Pandey, Eindhoven (NL); Duygu Akbulut, Eindhoven (NL); Alessandro Polo, Arendonk (BE); Simon Reinaid Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 93 days.

(21) Appl. No.: 16/470,905

(22) PCT Filed: Nov. 15, 2017

(86) PCT No.: PCT/EP2017/079345
§ 371 (c)(1),
(2) Date: Jun. 18, 2019

(87) PCT Pub. No.: WO2018/114152
PCT Pub. Date: Jun. 28, 2018

(65) Prior Publication Data
US 2020/0089135 A1   Mar. 19, 2020

(30) Foreign Application Priority Data
Dec. 19, 2016 (EP) .................................. 16204922

(51) Int. Cl.
*G01B 11/02* (2006.01)
*G03F 9/00* (2006.01)
*G03F 7/20* (2006.01)

(52) U.S. Cl.
CPC ........ *G03F 9/7088* (2013.01); *G03F 7/70633* (2013.01); *G03F 9/7049* (2013.01); *G03F 9/7076* (2013.01)

(58) Field of Classification Search
CPC .... G03F 9/7088; G03F 9/7049; G03F 9/7076; G03F 9/7096; G03F 7/70633
See application file for complete search history.

(56) References Cited

U.S. PATENT DOCUMENTS 6,950,196 B2   9/2005 Fielden et al.
6,961,116 B2   11/2005 Den Boef
(Continued)

FOREIGN PATENT DOCUMENTS

CN   101238362 A   8/2008
CN   103777467 A   5/2014
(Continued)

OTHER PUBLICATIONS

International Search Report issued in PCT/EP2017/079345, dated Jun. 4, 2018 (3 pages).
(Continued)

*Primary Examiner* — Tarifur R Chowdhury
*Assistant Examiner* — Jonathon Cook
(74) *Attorney, Agent, or Firm* — Sterne, Kessler, Goldstein & Fox P.L.L.C.

(57) ABSTRACT

Disclosed is a metrology sensor system, such as a position sensor. The system comprises an optical collection system configured to collect diffracted or scattered radiation from a metrology mark on a substrate, said collected radiation comprising at least one parameter-sensitive signal and noise signal which is not parameter-sensitive, a processing system operable to process the collected radiation; and a module housing. An optical guide is provided for guiding the at least one parameter-sensitive signal, separated from the noise
(Continued)

signal, from the processing system to a detection system outside of the housing. A detector detects the separated at least one parameter-sensitive signal. An obscuration for blocking zeroth order radiation and/or a demagnifying optical system may be provided between the optical guide and the detector.

15 Claims, 5 Drawing Sheets

(56) References Cited

U.S. PATENT DOCUMENTS

| | | | |
|---|---|---|---|
| 7,397,557 | B2 | 7/2008 | Jeong et al. |
| 7,564,534 | B2 | 7/2009 | Den Boef et al. |
| 8,610,092 | B2 | 12/2013 | Rue et al. |
| 9,733,572 | B2 | 8/2017 | Mathijssen |
| 9,927,726 | B2 | 3/2018 | Tinnemans et al. |
| 2006/0255298 | A1 | 11/2006 | Bykanov et al. |
| 2009/0195768 | A1 | 8/2009 | Bijnen et al. |
| 2010/0051831 | A1 | 3/2010 | Tao et al. |
| 2010/0181503 | A1 | 7/2010 | Yanagida et al. |
| 2011/0057126 | A1 | 3/2011 | Hoshino et al. |
| 2011/0069292 | A1* | 3/2011 | Den Boef ............ G03F 7/70625 355/67 |
| 2013/0128249 | A1 | 5/2013 | Redlitz |
| 2014/0168646 | A1 | 6/2014 | Barak et al. |
| 2015/0109624 | A1* | 4/2015 | Kreuzer ............ G03F 7/70108 356/508 |
| 2015/0227061 | A1* | 8/2015 | Tinnemans ........... G03F 9/7069 355/53 |
| 2015/0355554 | A1 | 12/2015 | Mathijssen |
| 2016/0161863 | A1 | 6/2016 | Den Boef |

FOREIGN PATENT DOCUMENTS

| | | |
|---|---|---|
| CN | 105190446 A | 12/2015 |
| JP | S63-229307 A | 9/1988 |
| JP | H01-109718 A | 4/1989 |
| JP | 2005-268237 A | 9/2005 |
| JP | 2014-229726 A | 12/2014 |
| JP | 2016-519765 A | 7/2016 |
| JP | 2016-223920 A | 12/2016 |
| JP | 2016-539356 A | 12/2016 |
| TW | 201143538 A | 12/2011 |
| TW | 201441775 A | 11/2014 |
| TW | 201638553 A | 11/2016 |
| WO | 2015051970 A1 | 4/2015 |
| WO | 2016030031 A1 | 3/2016 |
| WO | 2018041440 A1 | 3/2018 |

OTHER PUBLICATIONS

Written Opinion of the International Searching Authority directed to International Application No. PCT/EP2017/079345, dated Jun. 4, 2018; 7 pages.

International Preliminary Report on Patentability directed to International Application No. PCT/EP2017/079345, dated Jun. 25, 2019; 8 pages.

\* cited by examiner

METROLOGY SENSOR, LITHOGRAPHIC APPARATUS AND METHOD FOR MANUFACTURING DEVICES

CROSS-REFERENCE TO RELATED APPLICATIONS

This application is a 35 U.S.C. 371 National Phase of PCT Application No. PCT/EP2017/079345, filed on 15 Nov. 2017, which claims priority of EP application 16204922.5 which was filed on 19 Dec. 2016, both of which are hereby incorporated by reference herein in their entirety.

BACKGROUND

Field of the Invention

The present invention relates to methods and apparatus usable, for example, in the manufacture of devices by lithographic techniques, and to methods of manufacturing devices using lithographic techniques. The invention relates more particularly to metrology sensors and more specifically to position sensors and methods for determining the position of a mark on a substrate.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO2015051970A1 (Tinnemans et al). The contents of all of these publications are incorporated herein by reference.

In current metrology sensors, such as alignment sensors, radiation in the "zeroth diffraction order" (e.g., light that is scattered from the edges of the spot mirror, from surface roughness, from target edges, etc. which contains no signal information regarding the parameter being measured), which reaches the detector, limits the dynamic range of sensor. To compensate, the zeroth order stop may be increased in size to block more of the zeroth order scattered light and achieve sufficient wafer alignment performance. However, this may be undesirable due to volume, thermal, vibrational and/or other constraints, such as avoiding blocking of the desired first order diffraction orders, within the alignment sensor module.

SUMMARY OF THE INVENTION

The present invention in a first aspect aims to provide improved parameter-sensitive signal detection.

The present invention in a second aspect aims to provide reduced dark current detection.

The invention in a first aspect provides a metrology sensor system comprising: an optical collection system configured to collect diffracted or scattered radiation from a metrology mark on a substrate, said collected radiation comprising at least one parameter-sensitive signal and at least one noise signal; a processing system operable to process the collected radiation; a module housing, housing said processing system; at least one optical guide for guiding the at least one parameter-sensitive signal, separated from the at least one noise signal, from the processing system to a detection system outside of the housing; and at least one detector operable to detect the separated at least one parameter-sensitive signal.

Note that the term 'separated' is to be interpreted to mean 'separated in any way' or 'in any coordinate system'. Inside the optical guide, the light is typically not separated spatially, but only in terms of propagation direction. Such separation is encompassed by the term "separated".

The metrology sensor system may comprise at least one obscuration located outside of said housing. In an embodiment the obscuration is located between the optical guide and the detector. In an embodiment the obscuration is located in a pupil plane of an output face of said optical guide. In an embodiment the metrology sensor system comprises an optical system defining said pupil plane. In an embodiment the optical system is operable to demagnify the collected radiation prior to detection by said at least one detector. In an embodiment the magnification factor of said optical system is smaller than ½x. In an embodiment the ratio of areas of said at least one detector to the cross section of said at least one optical guide is at least 1:2. In an embodiment the magnification factor of said optical system is approximately ¼x. In an embodiment the ratio of areas of said at least one detector to the cross section of said at least one optical guide is at least 1:16. In an embodiment the metrology sensor system comprises a detector, an optical guide and an obscuration for each of a plurality of channels, each channel for detecting a different parameter-sensitive optical signal. In an embodiment the different parameter-sensitive optical signals comprise at least a sum signal obtained from a sum of corresponding detected higher orders of said collected radiation and a difference signal obtained from a difference of the corresponding detected higher orders of said collected radiation.

In an embodiment the obscuration is operable, at least selectively, to block said at least one noise signal.

In an embodiment the obscuration is selectively switchable into the path of the parameter-sensitive signal.

In an embodiment the size, shape and/or grey level intensity of the obscuration is adjustable. In an embodiment said obscuration comprises a plurality of elements of varying size and/or configuration, each one of said plurality of elements being selectively switchable into the path of the parameter-sensitive signal. In an embodiment said obscuration comprises a configurable spatial light modulation device.

In an embodiment said at least one detector comprises at least a first detection element for detecting said at least one parameter-sensitive signal and at least a second detection element for detecting said at least one noise signal. In an embodiment said at least a first detection element and said at least a second detection element comprise separate detectors. In an embodiment said at least a first detection element and said at least a second detection element comprise at least first pixels and at least second pixels of a camera device. In an embodiment the metrology sensor system as comprises an optical device between the optical guide and the at least one detector, said optical device operable to guide said at least one parameter-sensitive signal to said first detection element and to guide said at least one noise signal to said second detection element.

In an embodiment said at least one parameter-sensitive signal comprises multiple parameter-sensitive signals, each of a different wavelength and said at least one detector comprises separate detection elements for some or all of the parameter-sensitive signals.

In an embodiment metrology sensor system is a position sensor. In an embodiment said parameter-sensitive signal comprises a position-sensitive signal.

In an embodiment the processing system comprises an interferometry device.

In an embodiment the processing system comprises a self-referencing interferometer.

In an embodiment the collected radiation comprises radiation with wavelength longer than 1100 nm.

In an embodiment the processing system comprises a first processing sub-system for processing said collected radiation which is in a first wavelength range and a second processing sub-system for processing said collected radiation which is in a second wavelength range. In an embodiment said second wavelength range includes infrared radiation with wavelength longer than 1100 nm.

The invention in a second aspect provides a metrology sensor system comprising: an optical collection system configured to collect diffracted or scattered radiation from a metrology mark on a substrate, a processing system operable to process the collected radiation to derive at least one parameter-sensitive signal therefrom; a module housing, housing said processing system; at least one detector for detecting the collected radiation; at least one optical guide for directing the at least one parameter-sensitive signal from the processing system to the at least one detector; and an optical system operable to demagnify the collected radiation prior to detection by said detector.

In an embodiment the magnification factor of said optical system is smaller than ½x. In an embodiment the ratio of areas of said at least one detector to the cross section of said at least one optical guide is at least 1:2. In an embodiment the magnification factor of said optical system is approximately ½x. In an embodiment the ratio of areas of said at least one detector to the cross section of said at least one optical guide is at least 1:4.

In an embodiment the metrology sensor system comprises a detector, an optical guide and an optical system for each of a plurality of channels, each channel for detecting a different parameter-sensitive optical signal. In an embodiment the different parameter-sensitive optical signals comprise at least a sum signal obtained from a sum of corresponding detected higher orders of said collected radiation and a difference signal obtained from a difference of the corresponding detected higher orders of said collected radiation.

In an embodiment the metrology sensor system is a position sensor. In an embodiment said parameter-sensitive signal comprises a position-sensitive signal.

In an embodiment the processing system comprises an interferometry device.

In an embodiment the processing system comprises a self-referencing interferometer.

In an embodiment the collected radiation comprises radiation with wavelength longer than 1100 nm.

In an embodiment the processing system comprises a first processing sub-system for processing said collected radiation which is in a first wavelength range and a second processing sub-system for processing said collected radiation which is in a second wavelength range. In an embodiment said second wavelength range includes infrared radiation with wavelength longer than 1100 nm.

The invention also provides for a method of manufacturing devices wherein a device pattern is applied to a substrate using a lithographic process, the method including positioning the applied pattern by reference to measured positions of one or more marks formed on the substrate, the measured positions being obtained using a metrology sensor system of the first or second aspect.

The invention also provides for method of manufacturing devices wherein a device pattern is applied to a substrate using a lithographic process, the method including positioning the applied pattern by reference to measured positions of one or more marks formed on the substrate, the measured positions being obtained using a metrology sensor system according to the first aspect, and wherein said positioning comprises performing a coarse positioning step and a fine positioning step, wherein a pitch of the marks for which the positions are measured are larger for the coarse positioning step than for the fine positioning step; and wherein the obscuration is configured to be larger when performing the fine positioning step than when performing the coarse positioning step. In an embodiment the obscuration is switched out of the path of the parameter-sensitive signal when performing the coarse positioning step. In an embodiment the pattern is applied to an opaque layer, the measured positions being obtained using radiation with wavelength longer than 1100 nm.

The invention also provides for a lithographic apparatus for use in applying a pattern to a substrate, the lithographic apparatus including a metrology sensor system of the first or second aspect. In an embodiment the lithographic apparatus comprises a controller configured for causing the metrology sensor system to perform the method according to the invention.

The invention also provides for a sensor system, such as a metrology sensor system, comprising an optical collection system configured to collect diffracted and scattered radiation from a metrology mark on a substrate, said collected radiation comprising at least one parameter-sensitive signal, a processing system operable to process the collected radiation, a module housing, housing said processing system, at least one optical guide for guiding the at least one parameter-sensitive signal from the processing system to a detection system outside of the housing, and at least one detector operable to detect the at least one parameter-sensitive signal, wherein the optical guide has an input and an output, the collected radiation propagating from the input to the output and the at least one parameter-sensitive signal being contained in one or more angle ranges, each angle range being an angle range of an angle between the axial direction at the output and the radiation propagating at the output.

In an embodiment the system comprises a detector system comprising the at least one detector, the detector system being configured to guide the radiation within the one or more angle ranges to the at least one detector.

In an embodiment the system comprises a detector system comprising the at least one detector, the detector system being configured to guide at least a part of the radiation outside the one or more angle ranges away from the at least one detector.

In an embodiment the system comprises a detector system comprising the at least one detector, the detector system being configured to block at least a part of the radiation outside the one or more angle ranges from the at least one detector.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
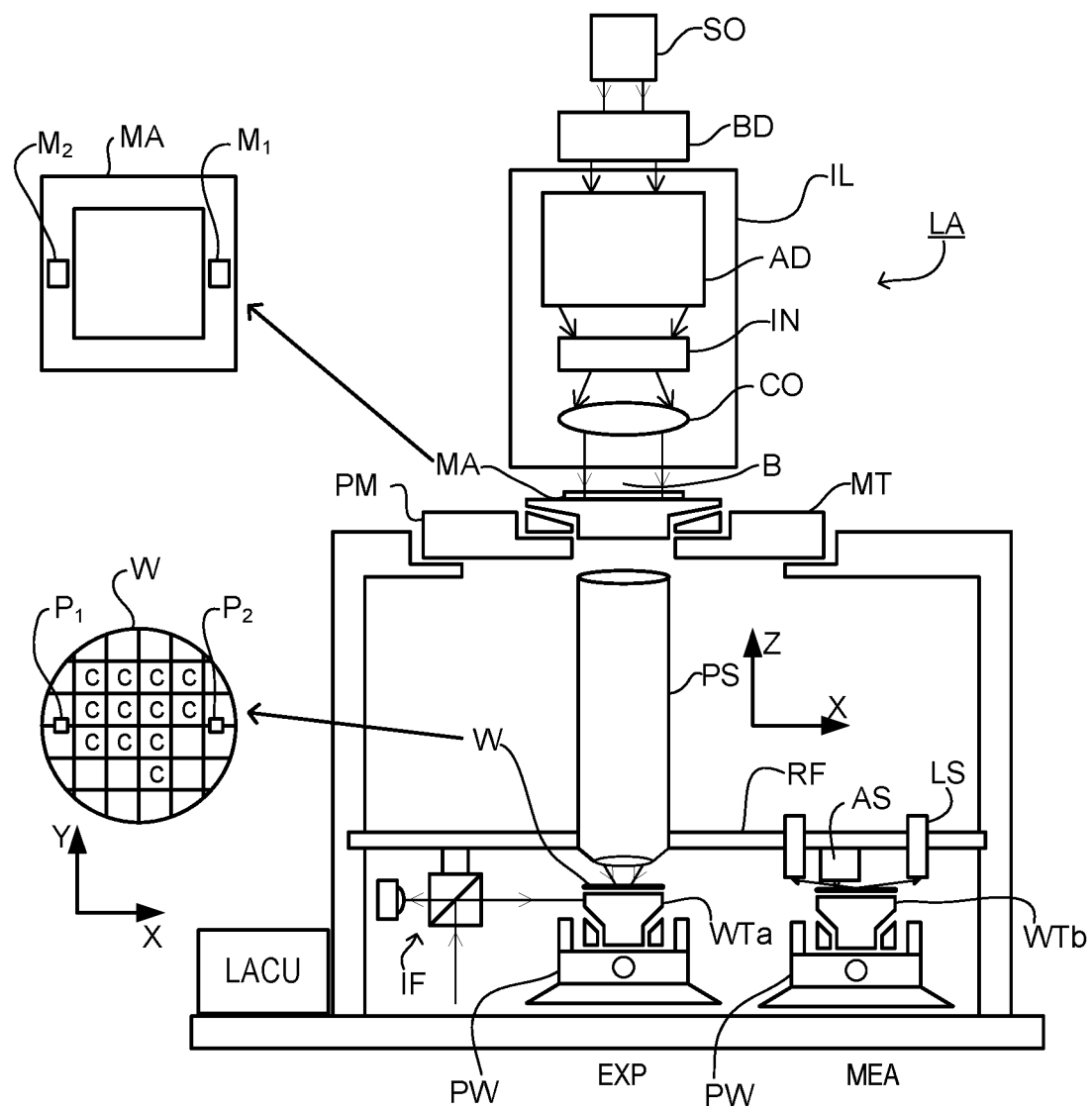
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Alignment Process Background

Figure 2:
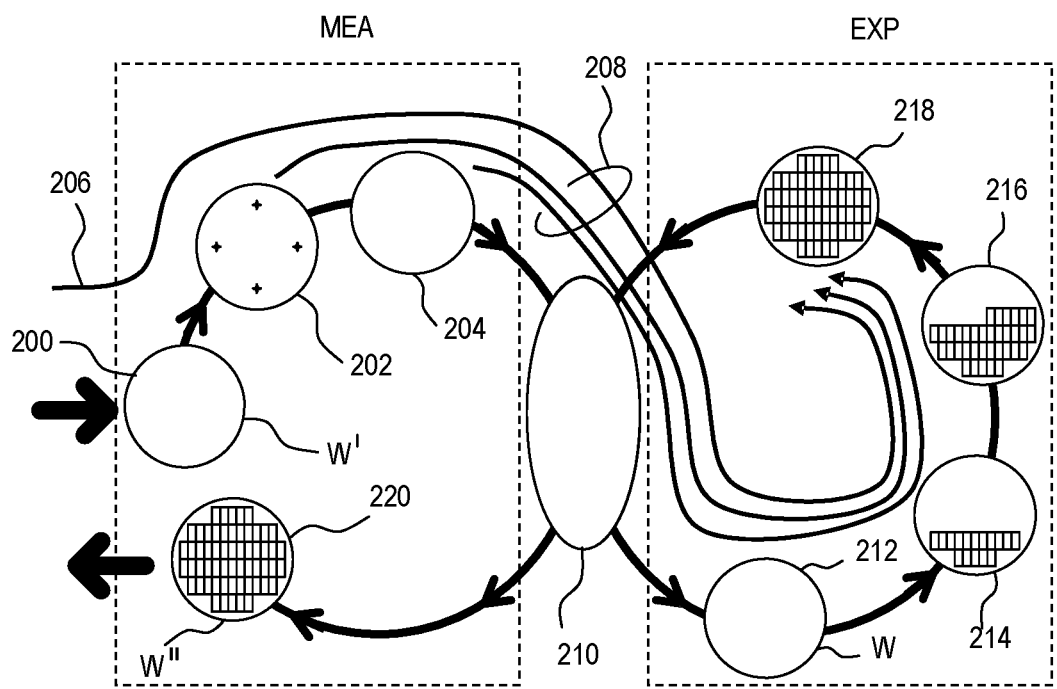
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Presently, optical position sensors, such as alignment sensor AS, use visible and/or near-infrared (NIR) radiation to read alignment marks. In some processes, processing of layers on the substrate after the alignment mark has been formed leads to situations in which the marks cannot be found by such an alignment sensor due to low or no signal strength. A low or zero signal strength can be caused for example by opaque layers on top of the marks which block radiation in the visible/NIR wavelength band, and therefore operation of the alignment sensor. To address this issue, it is known to produce additional marks in subsequent layers to facilitate mark detection. However, the production of these additional marks is expensive. Some processes rely on the production of an optical window on top of the existing marks, in such a way that only the material which is located on top of the marks is removed and therefore the marks can be measured. However, these also require additional processing steps and expense.

Figure 3:
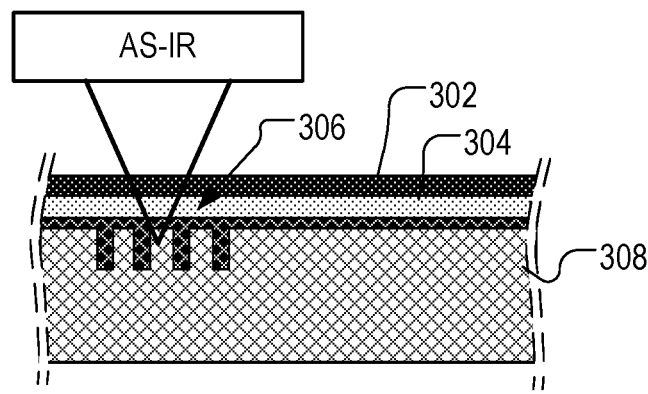
FIG. 3 illustrates schematically the use of a position sensor to measure the position of a target structure formed on a substrate, and a problem of an opaque overlying structure.

FIG. 3 illustrates an alternative solution, based on using an alignment sensor AS-IR which uses a much longer wavelength of radiation that can penetrate an opaque layer 302. The opaque layer 302 is formed over other material layers 304 and alignment mark 306 on substrate 308. Present alignment sensors currently operate at wavelengths between 500-900 nm. While this wavelength range includes infrared wavelengths near to the visible range, these are unable to penetrate common opaque layers. Transmission through such opaque layers is relatively high for longer IR wavelengths. To mitigate this, an alignment sensor AS-IR which can operate for example using radiation of wavelengths longer than 1000 nm, for example in the range between 1500-2500 nm, may be provided. The alignment mark 306 may be a conventional alignment mark, with conventional pitch or may be a special mark with, for example a longer grating pitch, which is better adapted to measurements with these longer wavelengths.

Figure 4:
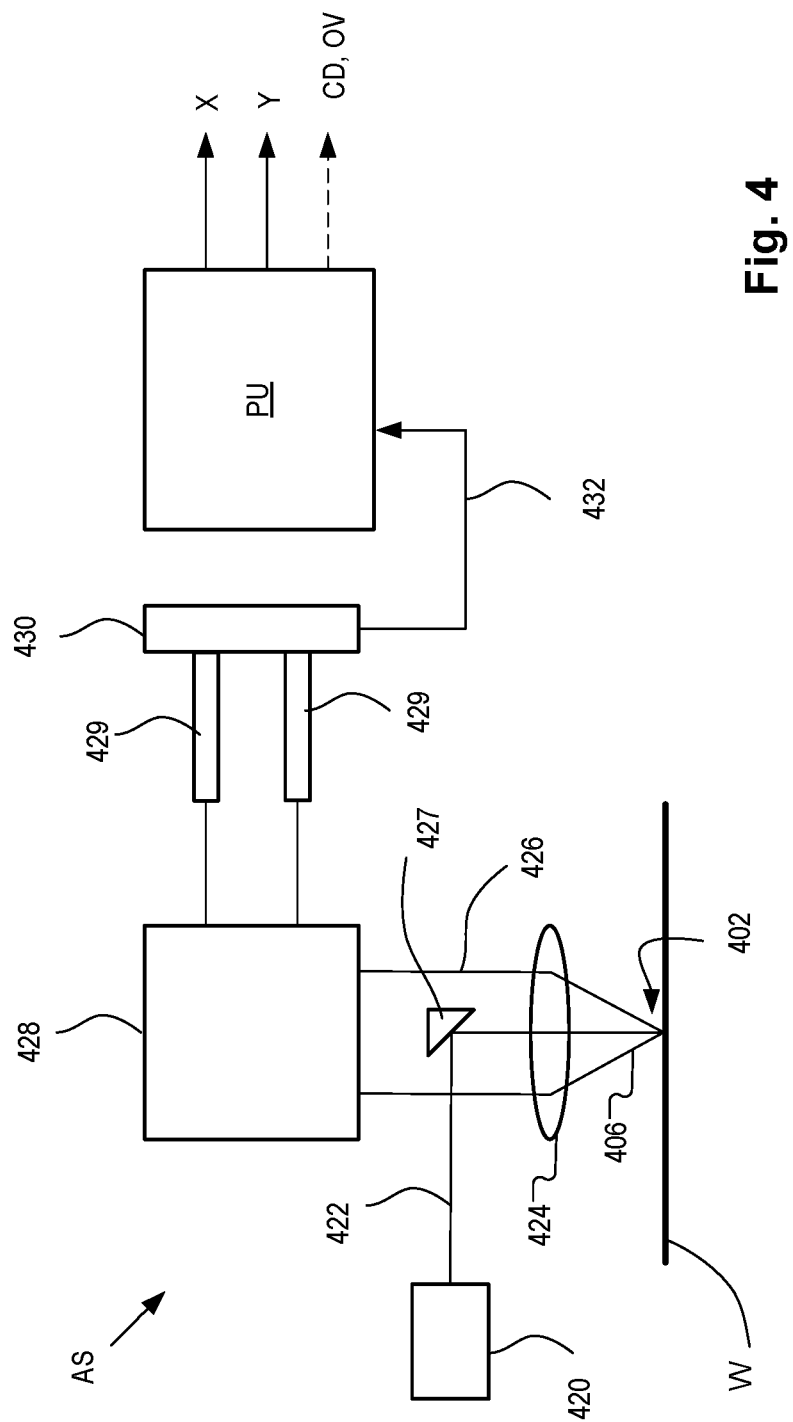
FIG. 4 illustrates schematically a position sensor adaptable according to an embodiment of the present invention

A simplified, schematic drawing of an example of a position sensor or alignment sensor according to one example of the present disclosure is shown in FIG. 4. Illumination source 420 provides a beam 422 of radiation of one of more wavelengths, which is diverted through an objective lens 424 via a spot mirror 427 onto an alignment mark such as alignment mark 402, located on substrate W. Radiation scattered by alignment mark 402 is picked up by objective lens 424 and collimated into an information-carrying beam 426. An optical analyzer 428 processes beam 426 and outputs separate beams onto a sensor array 430 via light guides (e.g. optical fibers) 429. Intensity signals 432 from individual sensors in sensor grid 430 are provided to a processing unit PU. By a combination of the optical processing in the block 428 and the computational processing in the unit PU, values for X- and Y-position on the substrate relative to the sensor are output. Alternatively, or in addition, other parameters may be measured such as overlay OV and/or critical dimension CD.

Figure 5:
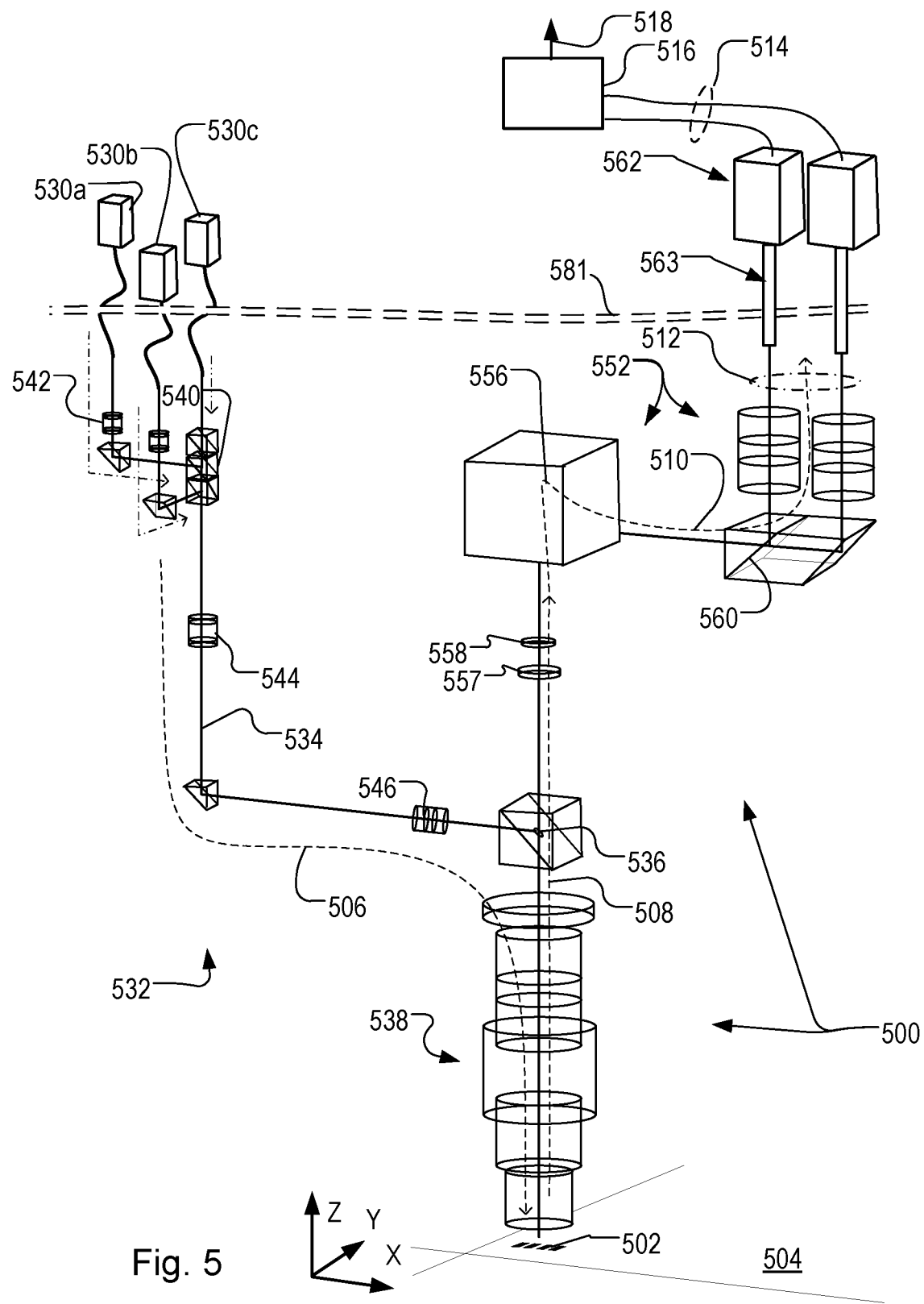
FIG. 5 illustrates schematically the optical system of a position sensor according to a first embodiment of the present invention.

FIG. 5 shows in more detail an example of a position sensor or alignment sensor according to one example of the present disclosure. This shows an alignment sensor operable to measure the position of an alignment mark 502 on a substrate 504. The position sensor comprises an optical system 500 operable to deliver, collect and process radiation to obtain position signals from the alignment mark.

The optical system is configured to deliver radiation to alignment mark 502 along a common illumination path (indicated by dashed line 506), to collect diffracted or scattered radiation from the substrate along a common collection path (indicated by dashed line 508), to process the collected radiation in processing path (indicated by dashed line 510). The optical system in the processing path 510 is operable to derive at least one position-sensitive signal 512 as the alignment mark 502 moves relative to the optical system 500. The signals labeled 512 are optical signals in this example, eventually converted to electrical signals 514 and processed by a processor 516 to produce one or more position measurements 518.

Detail of the construction and operation of such an alignment sensor can be found in the prior patent publications mentioned in the introduction, and will not be repeated here. Briefly, in the illumination path 506 there are provided a plurality of individual wavelength sources such as LEDs or laser sources 530a, 530b 530c. Three sources are shown in this example; however there may be only a single source, or a number of sources other than three. In the specific example shown here, the sources 530a, 530b 530c are arranged to supply different wavelengths of radiation, for example one or more of green and red visible light, near infrared (NIR) wavelengths and/or infrared radiation in the range 1500-2500 nm, optionally including a wavelength having a wavelength longer than 2000 nm. These different wavelengths may be polarized differently, to improve diversity of detection capability without increasing the number of sources or using moving parts. For example in the example described in US2015355554A1, four wavelengths in the visible/near infrared waveband (500-900 nm) are labelled R, G, N and F. R and F have a first polarization direction, while G and N have a second polarization direction, orthogonal to the first one. Additional sources can be provided, according to the required performance and expected operating conditions. The sources may be narrowband sources or broadband sources, and may be fixed frequency or tunable, coherent or incoherent. Although separate sources are shown, it is also possible that some or all of these wavelengths are derived from a single, broadband source and divided into different wavelength ranges. Sources can includes lasers, gas discharge sources, plasma sources, supercontinuum sources and inverse Compton scattering sources. A single source may be switchable between the different wavelengths, so that the different wavelengths are multiplexed over time, rather than by filters.

Whatever the source type, radiation of both wavebands is combined in an illumination sub-system 532 to form a single beam 534 following a common illumination path 506. The sources may or may not operate simultaneously, but the common illumination sub-system allows a compact construction within the housing of the position sensor, and within the lithographic tool LA or other apparatus. Beam 534 is deflected by a spot mirror 536 into an objective lens 538, which focuses the beam into a spot on the alignment target 502. Illumination sub-system 532 in this example includes a stack of dichroic mirrors 540 for diverting each wavelength of radiation into the beam 534. Lenses 542, 544 are provided which cooperate with objective lens 538 for conditioning the beam and focusing the spot. Also in the illumination sub-system a half-wave plate 546 or quarter-wave plate is provided to give the illumination polarization characteristics suitable for processing in a self-referencing interferometer.

Radiation reflected and diffracted by the alignment mark 502 is collected by the objective lens 538 into collection path 508. While the collected radiation is illustrated as a single beam on the optical axis, this information carrying beam is actually spread out by scattering and diffraction. An axial component representing a noise signal is at least partially blocked by the spot mirror 536, which thus acts as an obscuration or obscuration for blocking this noise signal. The remaining higher order diffracted radiation (and some stray noise signal) then enters a processing system 552. The noise signal may comprise all scattered radiation which does not include the desired signal information, and/or for which parameter-sensitive information is 'scrambled' and hard or impossible to extract. Such radiation essentially only adds noise. This noise signal may include inter alfa the zeroth order reflected radiation. Of course, the higher order parameter sensitive signal(s) will also comprise some noise, although such signals are not a noise signal in this context as they contain readily extractable parameter-sensitive information.

The nature of the processing system will depend on the desired performance and the type of mark provided. The processing system may be based on interferometry, or on imaging, or on a combination of techniques. The processing system may be substantially the same type as one another, or they may be completely different types. In the present example, it will be assumed that the processing system is based on interferometry, and comprises a self-referencing interferometer of the type described in the references.

Within the processing system 552, a self-referencing interferometer 556 receives the collected radiation via obscuration (obscuration) 557. The purpose of obscuration 557 is to control of which portions of the reflected and diffracted radiation are admitted into the processing system, additional to any spatial filtering provided by the spot mirror and natural aperture of the objective.

At the entrance of the interferometer 556, a half-wave plate 558 conditions the polarization of the radiation to 45 degrees. The interferometer then processes it in the manner described in the references, interfering the beam with a rotated copy of itself so that opposite diffraction orders interfere constructively and destructively. Polarizing beam splitter 560 separate "sum" and "difference" channels, which provide the position-sensitive optical signals 512 to a detection system 562, via optical fibers 563 or other suitable light guides (which may comprise hollow metal tubes etc.), which can be used to route the optical signals away to a more convenient location for demultiplexing and/or detection. The detection system 562 includes for each of the sum and difference channels, photodetectors for obtaining the desired electrical position signals 514. Where the waveband contains multiple wavelengths, then wavelength demultiplexers are included in the detection system, and individual photodetectors are provided to obtain an electrical signal 514 for each wavelength.

In the same way as described for the detection system 562, the sources 530a, 530b, 530c etc. may be located remotely, using optical fibers or other suitable light guides, as illustrated already in FIG. 5.

Due to the very low wafer qualities when aligning through opaque layers, signal levels will be orders of magnitude lower than typical alignment sensor signal levels when aligning through transparent layers. A corresponding improvement in the suppression of a noise signal is therefore required to achieve acceptable alignment performance. At present, there is no good solution for this. It is undesirable to make any obscuration within the alignment sensor module very large, because it reduces the pitch flexibility of the alignment sensor and complicates, for example, its coarse wafer alignment (COWA) ability. It is also undesirable to place a movable/tunable obscuration inside the alignment sensor module due to the corresponding vibrational and thermal impact. In fact, the present obscuration 557 already reduces pitch flexibility, and it would therefore be desirable to remove this (relying on only the spot mirror 536 within the module). The proposals described herein make this possible.

It is therefore proposed that the detection system is arranged to detect a desired optical signal angularly separated from the noise signal. The detection system may be arranged to detect only the desired optical signal and therefore to block the noise signal, or else it may detect both. Where the noise signal is blocked, detection system may include an obscuration between the output of the optical fibers/light guides 563 and the respective detector within detection system 562. As such, the detection system 562 may comprise an obscuration per-detector. This obscuration may be larger, or tunable to be larger, than obscuration 557 located within the alignment system module (the boundary of which is signified by double-dashed lines 581). This obscuration may replace the obscuration 557 within the module. The obscuration may be selectively tunable (e.g. in shape or size) or switchable into (e.g. movable in and out as required) the path of the optical signals 512. Such an obscuration may be located (or locatable) in a Fourier plane or pupil plane (not shown) of the optical fiber 563 output, and therefore the detection system 562 may comprise an imaging system after the optical fiber output defining a Fourier plane. While the Fourier plane of the optical fiber 563 output may be the preferred positions for the obscuration, it may be placed at a location other than the Fourier plane (except at the exact image planes of the optical fiber 563 output). In an optional embodiment, the optical system may demagnify the optical signal, allowing the use of smaller detectors (which have a smaller dark current count). Such a demagnifying imaging system may be comprised within detection system 562 even in the absence of the obscuration disclosed herein. Note that this obscuration and/or imaging system need not actually form part of the detection system 562, as such, provided it is located outside of the alignment system module (e.g., between the output of the optical fibers 563 and the respective detector within detection system 562).

The disclosed concepts have been discussed above in terms of a position or alignment sensor for measuring position of an alignment mark. It should be understood that such a position sensor can be used to measure other parameters such as overlay or critical dimension (CD) and the concepts are equally applicable to such measurements. As already stated, the actual alignment sensor/position sensor arrangement may differ from the example arrangement of FIG. 5. The sensor arrangement may be of a type other than a self-referencing interferometer type. The concepts are also equally applicable to other types of metrology sensor which measure higher-order diffraction radiation scattered from a target, and therefore requires the noise signal to be blocked as much as possible. It should be appreciated that an increased dynamic range and/or less dark current count (smaller detectors) is advantageous in all such metrology sensors.

The metrology sensor arrangement may comprise only a single processing system 552, as shown or more than one processing systems 552. In some instances, there may be advantages to having different processing paths for different wavebands, and a metrology sensor as disclosed herein may be so arranged. For example, there may be provided a first processing system for a visible/NIR waveband a second processing system for an infrared waveband.

Figure 6:
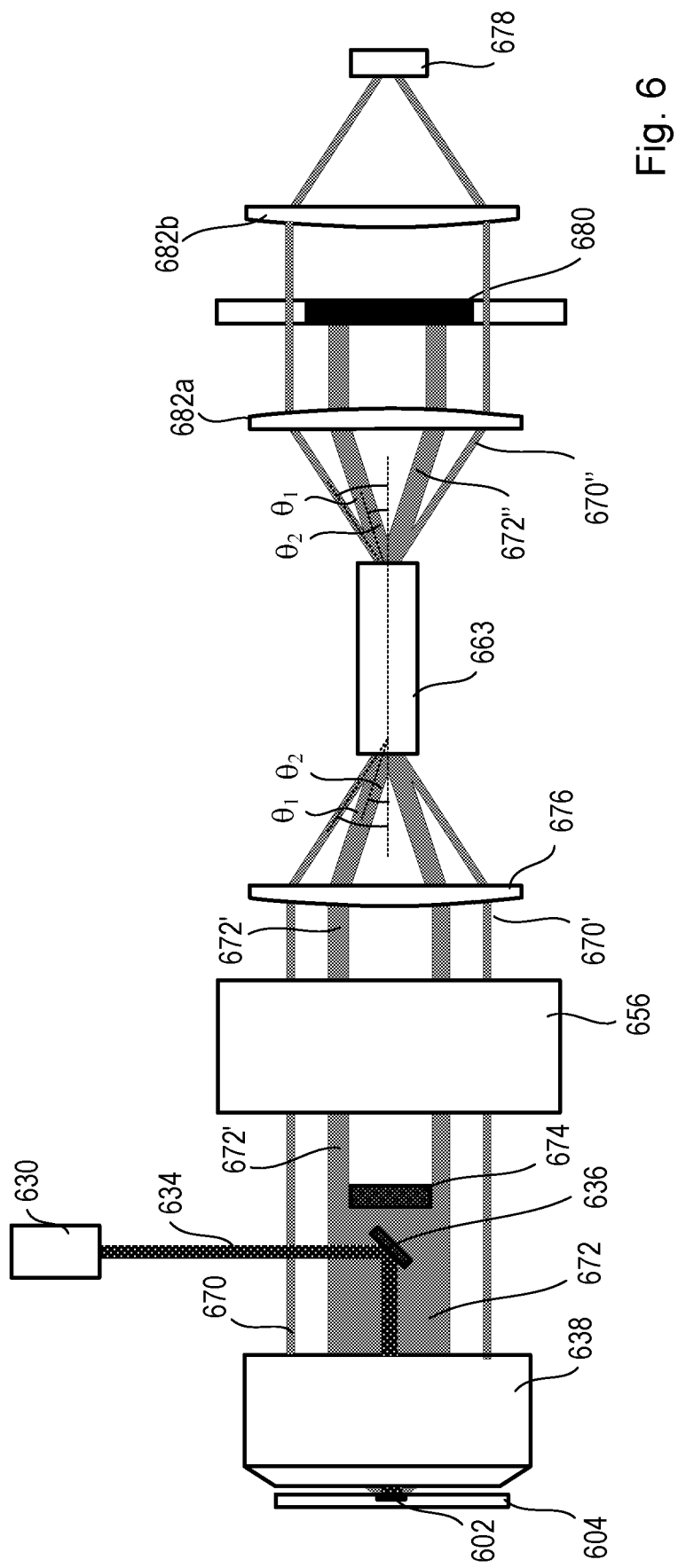
FIG. 6 illustrates schematically the optical system of a position sensor according to a second embodiment of the present invention.

FIG. 6 is a simplified schematic drawing showing a detail of a proposed arrangement for a single detector branch. Shown is an objective lens 638 focusing radiation 634 obtained from a radiation source 630 via a spot mirror 636 onto an alignment mark 602 on a substrate 604. The scattered radiation from alignment mark 602 comprises first (or other higher) diffraction orders 670 and noise signal 672. An obscuration 674 is shown which may be equivalent to obscuration 557 of FIG. 5. In any case, obscuration 674 is shown to be of insufficient size to block all the noise signal 672, allowing some stray noise signal 672' to pass into an interferometer 656 (which may be a self-referencing interferometer, e.g., self-referencing interferometer 556 of FIG. 5). For reasons already explained, it is often undesirable to make the obscuration 674 sufficiently large to block the stray noise signal 672'. As such, some of this stray noise signal 672' exits the interferometer 656 and is focused by lens 676 (along with the desired optical signals 670') into optical fiber 663, which transports the optical signals and stray noise signal 672' to a detector 678 (which may form part of a processing system equivalent to processing system 552 of FIG. 5). It can be seen in this example that (in the absence of obscuration 680) more stray noise signal 672' will reach detector 678 than the radiation of the desired optical signals 670'.

The inventors have appreciated that, for a light ray incident on a multimode fiber at coordinate $(x,y,\phi,\theta)$, where x, y denote position, $\phi$ denotes azimuthal angle and $\theta$ denotes the angle with respect to the normal, then $\theta$ at the output is equal to $\theta$ at the input (whereas x, y and $\phi$ are scrambled), and as a result the emerging ray spreads to fill an annulus of a cone twice angle $\theta$. This means that the angularly separated noise signal and higher (e.g., first) orders entering the optical fiber 663 will remain angularly separated when emerging from the optical fiber 663. Note that this is true for some other types of optical guides other than multimode fibers, and the concepts described herein are equally applicable to any such optical guides.

The stray noise signal 672' is generally incident on the optical fiber 663 at a relatively smaller angle $\theta_2$ than the incident angle $\theta_1$ of the desired optical signals (first/higher diffraction orders) 670'. This angular separation is conserved by the optical fiber 636. Therefore the emergent stray noise signal 672" and the desired optical signals 670" emerge also at angle $\theta_2$ and angle $\theta_1$ respectively, remaining separated. Note, of course that it is possible to eliminate stray noise signal 672' that is incident at an angle $\theta_2$ which is higher than the incident angle $\theta_1$ of the desired optical signals. And there can also be multiple signal angles $\theta_1$, e.g., where there are other higher diffraction orders. There may also be multiple signal angles $\theta_1$ due to multiple wavelength radiation being used.

A second (e.g., disk shaped or $\phi$ invariant) obscuration 680 is provided in a Fourier plane (pupil plane) outside of the alignment sensor, for example between the optical fiber 663 and the detector 678. Specifically, the Fourier plane may comprise the back focal plane of a lens (e.g., lens 682a), the front focal plane of which coincides with the exit face of the fiber 663. This obscuration 680 is sufficiently large to block the stray noise signal 672". This does not present a problem as obscuration 680 is located outside of the alignment sensor module and therefore the size of this second obscuration 680 is not constrained by the volume constraints within the module. As already stated, the obscuration 680 need not have to be exactly at the Fourier plane. In fact, there does not need to be a lens 682*a* (or lens 682*b*). For example, the obscuration 680 may be located at some distance from the fiber output face (without intervening optics) and a large detector may be located behind the obscuration 680 to capture the radiation. Such a plane will still be essentially equivalent to a Fourier plane.

In an embodiment, the obscuration 680 may be tunable and/or moveable, which is difficult to implement inside the alignment sensor module because of vibrational, heating and space constraints therein. A tunable obscuration 680 enables a small stop (or no stop) to be used when measuring on marks with large pitches (e.g. COWA), whereas a large stop can be used when performing fine alignment (FIWA) on marks with smaller pitches. There are a number of possible implementations of such a movable/tunable obscuration 680. One possible implementation comprises a set of disks of varying size which can be moved in and out of the beam, using e.g. a filter wheel. Another possible implementation comprises a spatial light modulator, such as a digital micro-mirror device, in which pixels can be turned 'on' (light is transmitted to the detector) or 'off' (light is deflected to a beam dump). A further implementation may be an obscuration or aperture disk with variable size, shape and/or grey level intensity.

While the above examples disclose an obscuration to block the noise signal, the concepts are not limited to arrangements with obscurations. Any arrangement comprising a detecting arrangement which detects a desired optical signal angularly separated from noise signal is included within the scope of the present disclosure. For example, instead of an obscuration, there may be provided an optical element which separates the signal into two parts: e.g., a first part comprising the desired signals detected at a first detector and a second part comprising the noise signal and/or other information to a second detector. In other embodiments, an additional physical device is not required: for example a small detector may be used to detect the central (noise signal) part and a 'larger' detector could detect the periphery comprising the desired signal. Or instead of two detectors, a camera could be used with the central pixels detecting the central (noise signal) part and outer pixels detecting the desired signal. In a variation of such embodiments, additional detectors or regions of pixels can be used to detect different parts of the desired signal. In particular, where multiple wavelength radiation is used simultaneously, the corresponding higher order diffraction signals for each wavelength will be incident on the fiber at a different incident angle $\theta_1$. As this angular separation is preserved, each higher order diffraction signal corresponding to a different wavelength can be separately detected. This means that a wavelength demultiplexer may not be required.

Another issue with the use of infrared radiation in alignment sensing is that the dark current detection is very much higher for infrared detectors than for visible light detectors. Since dark current scales with detector area, a small detector is preferred. However, present detection arrangements use optical fibers 536*a*, 536*b*, 636 of particular diameter, and it is not trivial to simply make these optical fibers smaller. The fiber size is limited by the spot size on the target. The spot size on the target is relatively large and all of the light should be captured. As each detector 678 is typically attached to the optical fiber, the detectors should be of comparable diameter (for example 300 µm diameter).

To address this, the imaging system 682*a*, 682*b* which defines the Fourier plane can also be arranged to demagnify the optical fiber 663 output. In an embodiment, the factor of this demagnification may be 4 (e.g. ¼× magnification), as this is close to the physical upper limit due to the conversation of etendue (using a silicon solid immersion lens or similar might improve this by another (approximate) factor of 4 though due to the very high index). This means the detector area, and therefore the dark current, can be decreased by a factor of $4^2=16$. When the wafer quality is low and dark current is limiting, which is the important regime, this improves the reproducibility of the alignment position by a factor of 4.

There are many possible implementations within the principles of the present disclosure other than those specifically described and illustrated. The embodiment relating to the obscuration outside of the sensor module and the embodiment relating to the demagnifying imaging system may each be implemented alone. The principles of the present disclosure can be applied to other types of metrology sensors, not only alignment sensors, and metrology sensors with self-referencing interferometers, or interferometers more generally. The wavelength range(s) can be different to the examples given above. For future applications, extension of the sensing wavelengths into ultraviolet wavelengths may be considered, for example. The principles of the present disclosure can be used in combination with other techniques, including those introduced in the prior patents and patent applications mentioned in the introduction. For example, WO2015051970A1 discloses a modification of the known position sensor to include a polarization-resolving capability. A polarizing beam splitter divides the collected radiation into two different paths, according to its polarization. Each path then has its own processing sub-system with a self-referencing interferometer. Similarly, a position sensor may comprise a different processing sub-system with a self-referencing interferometer per waveband (e.g., a visible/NIR waveband and an infrared waveband). These concepts may be combined to provide four (or more) processing sub-systems, one for each waveband/polarization combination.

While specific embodiments of the invention have been described above, it will be appreciated that the invention may be practiced otherwise than as described.

While the example structures described above as marks are grating structures specifically designed and formed for the purposes of position measurement, in other embodiments, positions may be measured on structures which are functional parts of devices formed on the substrate. Many devices have regular, grating-like structures. The terms "mark" and "grating structure" as used herein do not require that the structure has been provided specifically for the measurement being performed. An opaque layer is not the only kind of overlying structure that may disrupt measurement of the position of the mark by observing the mark in conventional wavelengths. For example, surface roughness, or a conflicting periodic structure, may interfere with measurement at one or more wavelengths.

In association with the position measuring hardware and suitable structures realized on substrates and patterning devices, an embodiment may include a computer program containing one or more sequences of machine-readable instructions implementing methods of measurement of the type illustrated above to obtain information about the position of the mark covered by an overlying structure. This computer program may be executed, for example, by a processor 606 or the like which is dedicated to that purpose, or is integrated in the control unit LACU of FIG. 1. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A metrology sensor system comprising:
an optical collection system configured to collect diffracted or scattered radiation having a wavelength greater than 1000 nm from a metrology mark on a substrate, the collected radiation comprising at least one parameter-sensitive signal and at least one noise signal;
a processing system operable to process the collected radiation;
a module housing configured to house the processing system;
at least one optical guide configured to guide the at least one parameter-sensitive signal, separated from the at least one noise signal, from the processing system to a detection system outside of the housing;
at least one detector, disposed at the detection system, comprising at least a first detection element configured to detect the separated at least one parameter-sensitive signal; and
an obscuration device optically disposed between an output of the optical guide and the at least one detector and wherein the obscuration device is configured to selectively block or pass the at least one noise signal.

2. A metrology sensor system as claimed in claim 1, wherein the obscuration is located in a pupil plane of an output face of said optical guide.

3. A metrology sensor system as claimed in claim 2, comprising an optical system defining said pupil plane.

4. A metrology sensor system as claimed in claim 3, wherein the optical system is operable to demagnify the collected radiation prior to detection by said at least one detector.

5. A metrology sensor system as claimed in claim 1, wherein the obscuration is selectively switchable into the path of the parameter-sensitive signal.

6. A metrology sensor system as claimed in claim 1, wherein the size, shape and/or grey level intensity of the obscuration is adjustable.

7. A metrology sensor system as claimed in claim 1, wherein said at least one detector further comprises a second detection element for detecting said at least one noise signal when not blocked by the obscuration device.

8. A metrology sensor system as claimed in claim 7, wherein said optical device is operable to guide said at least one parameter-sensitive signal to said first detection element and to guide said at least one noise signal to said second detection element.

9. A metrology sensor system as claimed in claim 1, wherein the processing system comprises a first processing sub-system for processing said collected radiation which is in a first wavelength range and a second processing sub-system for processing said collected radiation which is in a second wavelength range.

10. A metrology sensor system as claimed in claim 1, wherein the at least one detector is a first detector, the at least one optical guide is a first optical guide, and the obscuration is a first obscuration, a first channel comprising the first detector, the first optical guide, and the first obscuration, the metrology sensor system further comprising a second channel for detecting a second parameter-sensitive optical signal, the second channel comprising a second detector, a second optical guide, and a second obscuration.

11. A metrology sensor system comprising:
an optical collection system configured to collect diffracted or scattered radiation having a wavelength greater than 1000 nm from a metrology mark on a substrate,
a processing system operable to process the collected radiation to derive at least one parameter-sensitive signal therefrom;
a module housing configured to house the processing system and separated from the optical collection system;
at least one detector configured to detect the collected radiation and being disposed within module housing;
at least one optical guide configured to direct the at least one parameter-sensitive signal from the processing system to the at least one detector;
an obscuration device optically disposed between an output of the optical guide and the at least one detector and wherein the obscuration device is configured to selectively block or pass a 0th order diffraction signal corresponding to the collected radiation; and
an optical system operable to demagnify the collected radiation prior to detection by said detector.

12. A sensor system, such as a metrology sensor system, comprising:
an optical collection system configured to collect diffracted and scattered radiation having a wavelength greater than 1000 nm from a metrology mark on a substrate, said collected radiation comprising at least one parameter-sensitive signal;
a processing system operable to process the collected radiation;

a module housing configured to house the processing system;

at least one optical guide configured to guide the at least one parameter-sensitive signal from the processing system to a detection system outside of the housing;

at least one detector operable to detect the at least one parameter-sensitive signal, wherein the optical guide has an input and an output, the collected radiation propagating from the input to the output and the at least one parameter-sensitive signal being contained in one or more angle ranges, each angle range being an angle range of an angle between the axial direction at the output and the radiation propagating at the output; and an obscuration device optically disposed between the output of the optical guide and the at least one detector and wherein the obscuration device is configured to selectively block or pass a 0th order diffraction signal corresponding to the collected radiation.

13. A method of manufacturing devices wherein a device pattern is applied to a substrate using a lithographic process, the method comprising:

measuring positions of at least one mark formed on the substrate by:

collecting diffracted or scattered radiation having a wavelength greater than 1000 nm from the at least one mark, the collected radiation comprising at least one parameter-sensitive signal and at least one noise signal, processing the collected radiation using a processing system in a housing, guiding, using at least one optical guide, the at least one parameter-sensitive signal, separated from the at least one noise signal, from the processing system to a detection system outside of the housing, wherein the detection system has at least one detector, optically disposing an obscuration device between an output of the at least one optical guide and the at least one detector and wherein the obscuration device is configured to selectively block or pass a 0th order diffraction signal corresponding to the collected radiation, and using the detection system to detect the separated at least one parameter-sensitive signal; and positioning the applied pattern by reference to measured positions.

14. A method of manufacturing devices wherein a device pattern is applied to a substrate using a lithographic process, the method comprising:

measuring positions of at least two marks formed on the substrate by:

collecting diffracted or scattered radiation from the at least one mark, the collected radiation comprising at least one parameter-sensitive signal and at least one noise signal, processing the collected radiation using a processing system in a housing, guiding the at least one parameter-sensitive signal, separated from the at least one noise signal, from the processing system to a detection system outside of the housing, blocking the at least one noise signal using an obscuration located outside of the housing, and using the detection system to detect the separated at least one parameter-sensitive signal; and positioning the applied pattern by reference to measured positions, the positioning including performing a coarse positioning step and a fine positioning step, wherein a pitch of the marks for which the positions are measured is larger for the coarse positioning step than for the fine positioning step; and wherein the blocking step comprises making the obscuration larger when performing the fine positioning step than when performing the coarse positioning step.

15. A lithographic apparatus for use in applying a pattern to a substrate, the lithographic apparatus including a metrology sensor system, the metrology sensor system including:

an optical collection system configured to collect diffracted or scattered radiation having a wavelength greater than 1000 nm from a metrology mark on a substrate, said collected radiation comprising at least one parameter-sensitive signal and at least one noise signal;

a processing system operable to process the collected radiation;

a module housing configured to house the processing system;

at least one optical guide configured to guide the at least one parameter-sensitive signal, separated from the at least one noise signal, from the processing system to a detection system outside of the housing;

at least one detector operable to detect the separated at least one parameter-sensitive signal; and an obscuration device optically disposed between an output of the optical guide and the at least one detector and wherein the obscuration device is configured to selectively block or pass a 0th order diffraction signal corresponding to the collected radiation.

* * * * *

UNITED STATES PATENT AND TRADEMARK OFFICE
CERTIFICATE OF CORRECTION

PATENT NO. : 11,086,240 B2  
APPLICATION NO. : 16/470905  
DATED : August 10, 2021  
INVENTOR(S) : Goorden et al.

It is certified that error appears in the above-identified patent and that said Letters Patent is hereby corrected as shown below:

On the Title Page

Item (72), replace "Simon Reinaid Huisman" with --Simon Reinald Huisman--.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*